(12) United States Patent
Ko et al.

(10) Patent No.: US 8,692,313 B2
(45) Date of Patent: Apr. 8, 2014

(54) NON-VOLATILE MEMORY DEVICE AND METHOD FOR FABRICATING THE SAME

(75) Inventors: Eun-Jung Ko, Gyeonggi-do (KR);
Dae-Young Seo, Gyeonggi-do (KR);
Sang-Moo Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/458,225

(22) Filed: Apr. 27, 2012

(65) Prior Publication Data

US 2012/0273867 A1  Nov. 1, 2012

(30) Foreign Application Priority Data

Apr. 29, 2011 (KR) .......................... 10-2011-0040893
Dec. 13, 2011 (KR) .......................... 10-2011-0133970

(51) Int. Cl.
*H01L 29/792* (2006.01)
(52) U.S. Cl.
USPC .................... 257/324; 257/328; 257/E27.096
(58) Field of Classification Search
USPC .................. 257/316, 319, 324, 328, E27.096; 438/268
See application file for complete search history.

(56) References Cited

U.S. PATENT DOCUMENTS

| | | | |
|---|---|---|---|
| 7,808,038 B2 * | 10/2010 | Mokhlesi et al. | 257/328 |
| 8,203,884 B2 * | 6/2012 | Kito et al. | 365/185.18 |
| 2011/0291177 A1 * | 12/2011 | Lee et al. | 257/324 |
| 2012/0018796 A1 * | 1/2012 | Yahashi et al. | 257/324 |
| 2012/0091521 A1 * | 4/2012 | Goda | 257/328 |
| 2013/0100741 A1 * | 4/2013 | Choi et al. | 365/185.18 |

* cited by examiner

*Primary Examiner* — Tuan N. Quach
(74) *Attorney, Agent, or Firm* — IP & T Group LLP

(57) ABSTRACT

A non-volatile memory device includes a substrate; a first conductive layer over the substrate, a second conductive layer over the first conductive layer, a stacked structure disposed over the second conductive layer, wherein the stacked structure includes a plurality of first inter-layer dielectric layers and a plurality of third conductive layers alternately stacked, a pair of first channels that penetrate the stacked structure and the second conductive layer, a second channel which is buried in the first conductive layer, covered by the second conductive layer, and coupled to lower ends of the pair of the first channels; and a memory layer formed along internal walls of the first and second channels.

8 Claims, 21 Drawing Sheets

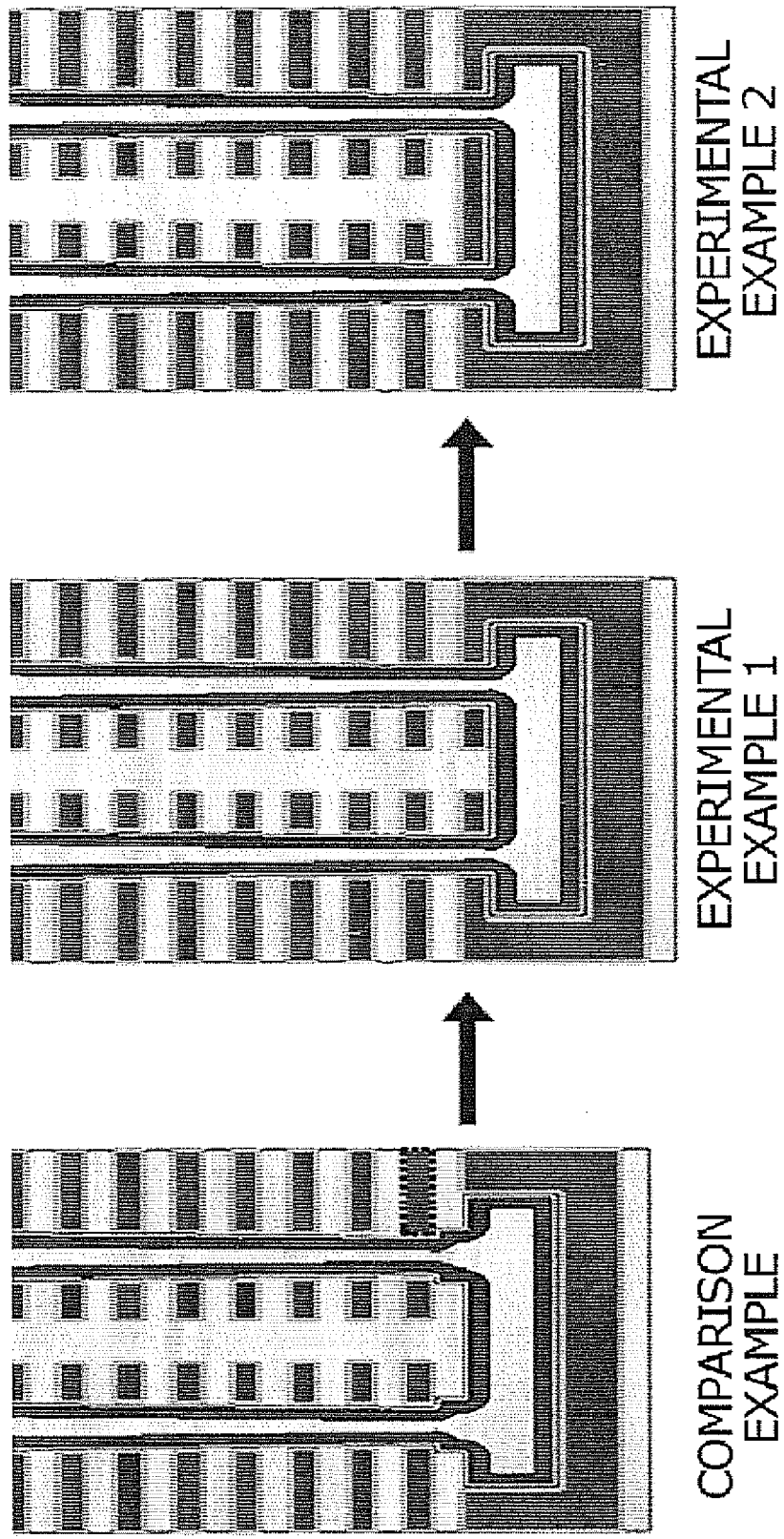

NON-VOLATILE MEMORY DEVICE AND METHOD FOR FABRICATING THE SAME

CROSS-REFERENCE TO RELATED APPLICATIONS

The present application claims priority of Korean Patent Application Nos. 10-2011-0040893 and 10-2011-0133970, filed on Apr. 29, 2011, and Dec. 13, 2011, which are incorporated herein by reference in their entirety.

BACKGROUND

1. Field

Exemplary embodiments of the present invention relate to a non-volatile memory device and a fabrication method thereof, and more particularly, to a non-volatile memory device having a three-dimensional structure where memory cells are formed along the channels perpendicularly protruding from a substrate, and a method for fabricating the non-volatile memory device.

2. Description of the Related Art

Non-volatile memory device retains data although power is turned off. Diverse non-volatile memory devices, such as flash memory devices, are widely used.

A memory device having a two-dimensional structure is formed in a single layer on a silicon substrate and has reached its structural limitation in increasing the integration degree thereof. For alleviating the above concern, a non-volatile memory device having a three-dimensional structure has been suggested. The non-volatile memory device includes a plurality of memory cells stacked along channels and the channels are protruded perpendicularly from a silicon substrate.

FIG. 1 is a cross-sectional view illustrating a conventional non-volatile memory device having a three-dimensional structure.

Referring to FIG. 1, a first conductive layer 12 for forming a gate electrode of a pipe channel transistor is formed over a substrate 11, and a stacked structure, where a second conductive layer 14 for forming the gates of a plurality of memory cells and an inter-layer dielectric layer 13 for isolating or separating each layer of the second conductive layer 14 are alternately stacked, is formed over the first conductive layer 12. The stacked structure, where the inter-layer dielectric layer 13 and the second conductive layer 14 are alternately stacked, is referred to as a cell gate structure CGS hereinafter.

A pair of cell channel holes is disposed inside the cell gate structure CGS by penetrating the cell gate structure CGS, and a pipe channel hole for coupling the cell channel holes of the lower portions is disposed inside the first conductive layer 12. A memory layer 15 is formed on the internal walls of the cell channel holes and the pipe channel hole, and the cell channel holes and the pipe channel hole with the memory layer 15 are filled with a channel layer 16.

As a result, the first conductive layer 12 and a pipe channel transistor formed of the memory layer 15 and the channel layer 16 that are formed inside the pipe channel hole are disposed over the substrate 11. Over the pipe channel transistor, the memory layer 15 and the channel layer 16 are formed inside the pair of the cell channel holes. A plurality of memory cells, that are formed of the second conductive layers 14, are stacked vertically along the memory layer 15 and the channel layer 16 and isolated for each cell channel hole by a slit T. The memory cells isolated for each cell channel hole are serially coupled through the pipe channel transistor disposed under the memory cells so as to form a string.

According to the conventional technology, however, the first conductive layer 12 that is used as a gate electrode of the pipe channel transistor is to be isolated from the second conductive layer 14 that is used as a gate electrode of a memory cell. Therefore, the inter-layer dielectric layer 13 is disposed over the first conductive layer 12.

The presence of the inter-layer dielectric layer 13 allows the first conductive layer 12 to be contacted with the side surface and lower surface of the channel layer 16 that fills the pipe channel hole. In this case, a gate bias applied to the first conductive layer 12 may not adequately supplied to the channel layer 16 that fills the pipe channel hole. In particular, since an inversion layer is not formed in the channel layer 16 in the region (refer to 'A') between the first conductive layer 12 and the lowermost second conductive layer 14, on current (Ion) characteristics of the pipe channel transistor may be deteriorated, which leads to poor operation of the non-volatile memory device.

SUMMARY

Exemplary embodiments of the present invention are directed to a non-volatile memory device having a three-dimensional structure, where memory cells are formed along channels perpendicularly protruding from a surface and a pipe channel transistor is disposed under the memory cells, and having improved operation characteristics, and a method for fabricating the non-volatile memory device.

In accordance with an exemplary embodiment of the present invention, a non-volatile memory device includes a substrate, a first conductive layer over the substrate, a second conductive layer over the first conductive layer, a stacked structure disposed over the second conductive layer, wherein the stacked structure includes a plurality of first inter-layer dielectric layers and a plurality of third conductive layers alternately stacked, a pair of first channels that penetrate the stacked structure and the second conductive layer, a second channel which is buried in the first conductive layer, covered by the second conductive layer, and coupled to lower ends of the pair of the first channels with each other, and a memory layer formed along internal walls of the first and second channels.

In accordance with another exemplary embodiment of the present invention, a method for fabricating a non-volatile memory device includes forming a first conductive layer having a first sacrificial layer pattern inside over a substrate, forming a second conductive layer over the first sacrificial layer pattern and the first conductive layer, forming a stacked structure including a plurality of first material layers and a plurality of second material layers stacked alternately over the second conductive layer, forming a pair of first channel holes that expose the first sacrificial layer pattern by penetrating the stacked structure and the second conductive layer, forming a second channel hole coupled to the pair of the first channel holes by removing the first sacrificial layer pattern, and forming a memory layer and a channel layer on internal walls of the second channel hole and the pair of the first channel holes.

BRIEF DESCRIPTION OF THE DRAWINGS

FIGS. 13A to 13C illustrate the effects of the non-volatile memory device in accordance with an exemplary embodiment of the present invention.

DETAILED DESCRIPTION

Figure 1:
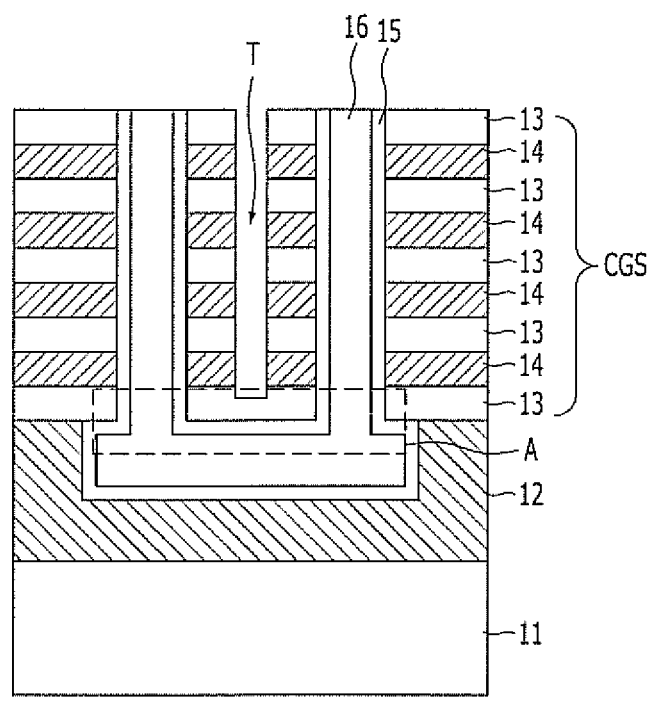
FIG. 1 is a cross-sectional view illustrating a conventional non-volatile memory device having a three-dimensional structure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 10:
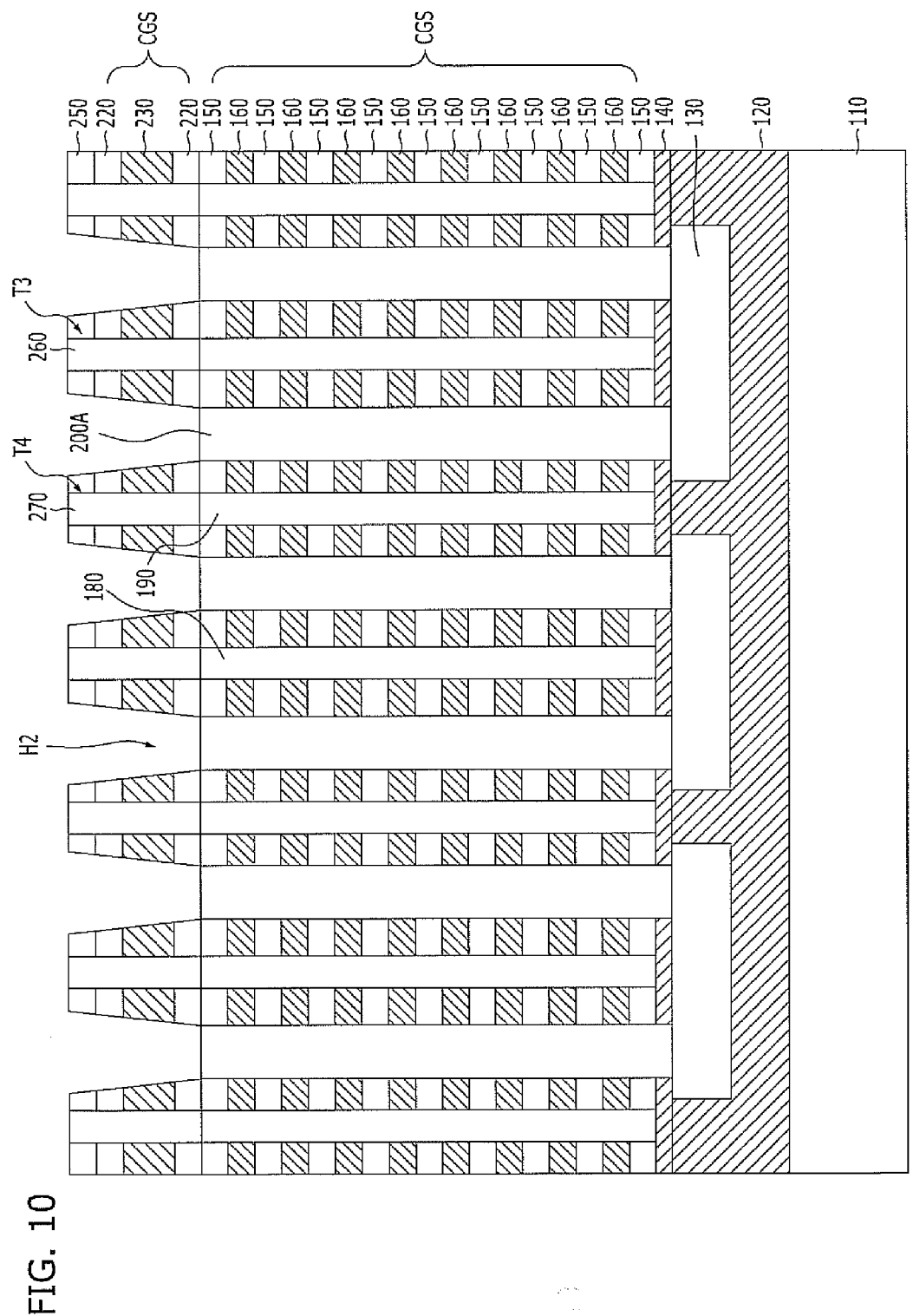
Figure 11:
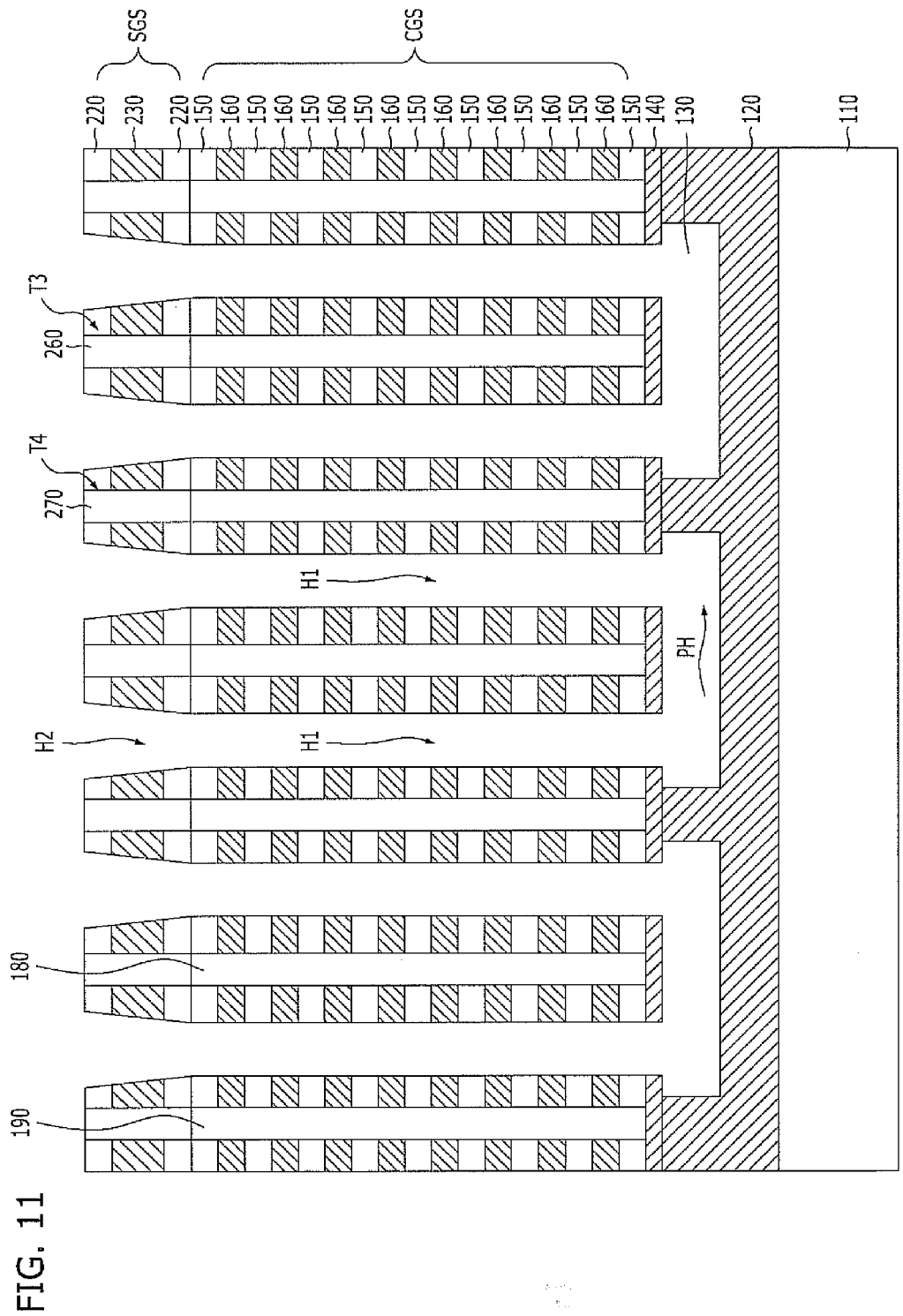
Figure 12:
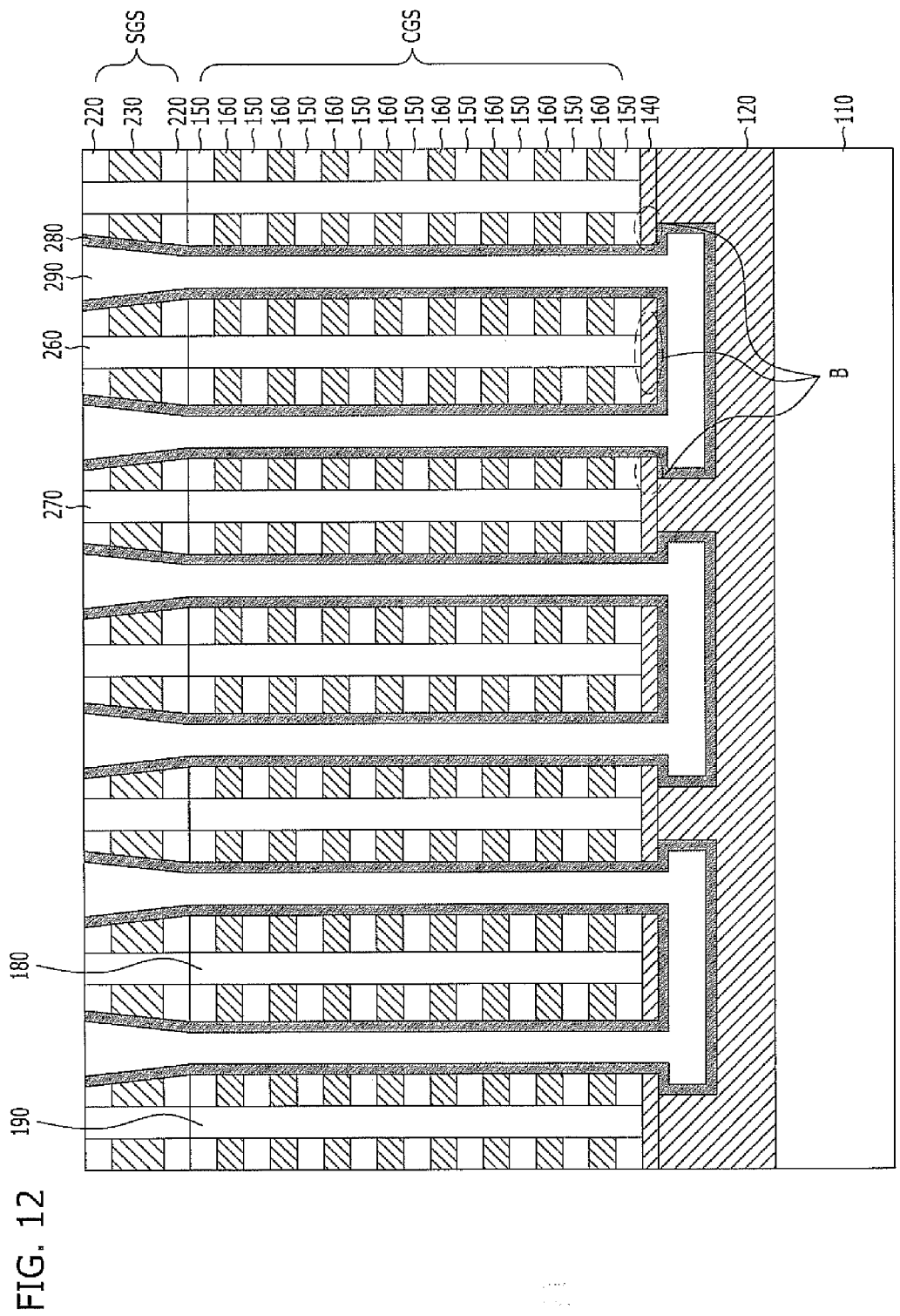

FIGS. 2 to 12 are cross-sectional views illustrating a non-volatile memory device having a three-dimensional structure and a fabrication method thereof in accordance with a first exemplary embodiment of the present invention. Particularly, FIG. 12 is a cross-sectional view illustrating a non-volatile memory device having a three-dimensional structure in accordance with the first exemplary embodiment of the present invention. FIGS. 2 to 11 are cross-sectional views illustrating intermediate processes for fabricating the non-volatile memory device shown in FIG. 12.

Figure 2:
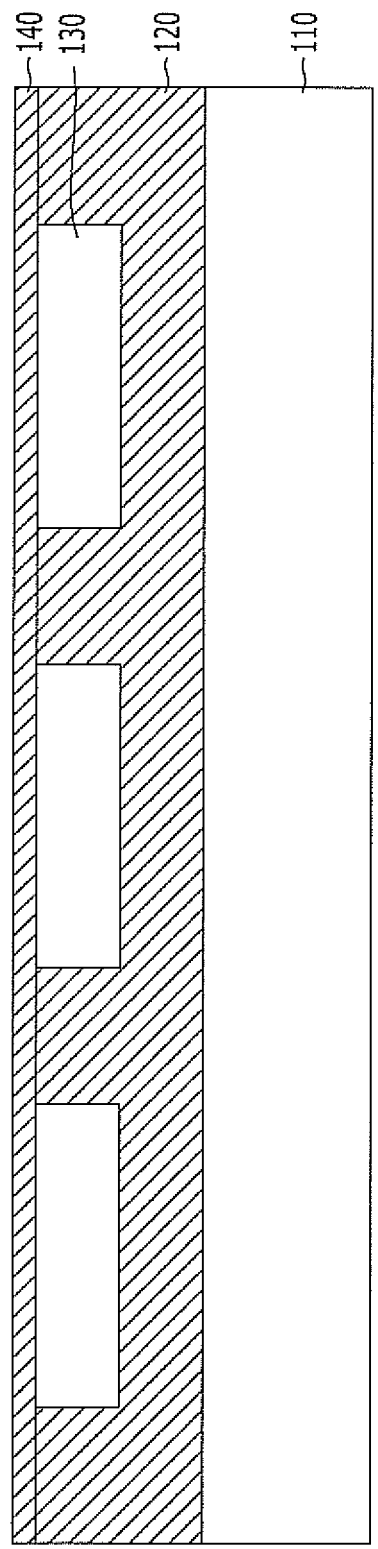
FIGS. 2 to 12 are cross-sectional views illustrating a non-volatile memory device having a three-dimensional structure and a fabrication method thereof in accordance with a first exemplary embodiment of the present invention.

Referring to FIG. 2, a first conductive layer 120 for forming a gate electrode of a pipe channel transistor is formed over a substrate 110.

The substrate 110 may include a semiconductor substrate, such as a silicon substrate, and an insulation layer disposed over the semiconductor substrate, such as a silicon oxide layer. The first conductive layer 120 may include a polysilicon layer doped with an impurity.

Subsequently, a groove is formed in the first conductive layer 120 by selectively etching the first conductive layer 120, and a first sacrificial layer pattern 130 buried inside the first conductive layer 120 is formed by filling the groove with a dielectric material, e.g., a silicon nitride layer.

The first sacrificial layer pattern 130 defines a space where a channel of a pipe channel transistor, which is to be described below, is to be formed. The space is referred to as a pipe channel hole, hereinafter. The pipe channel hole, i.e., the first sacrificial layer pattern 130 may have a longitudinal axis of the cross-sectional direction shown in the drawing (referred as a x-axis direction) and a horizontal axis of a direction crossing the cross-sectional direction (referred as a z-axis direction). A plurality of the first sacrificial layer patterns 130 may be arrayed in a matrix type along the cross-sectional direction shown in the drawing (the x-axis direction) and the direction crossing the cross-sectional direction (the y-axis direction). Although the drawing exemplarily shows three first sacrificial layer patterns 130 arrayed in the cross-sectional direction (the x-axis direction), the scope and spirit of the present invention are not limited to it.

Subsequently, a second conductive layer 140 for forming a gate electrode of a pipe channel transistor is formed over the first conductive layer 120 and the first sacrificial layer patterns 130.

In other words, the second conductive layer 140 may be used as a gate electrode of a pipe channel transistor along with the first conductive layer 120. The second conductive layer 140 may include the same material as the first conductive layer 120, for example, a polysilicon layer doped with an impurity, or the second conductive layer 140 may be formed of a metal or a metal silicide.

Figure 3:
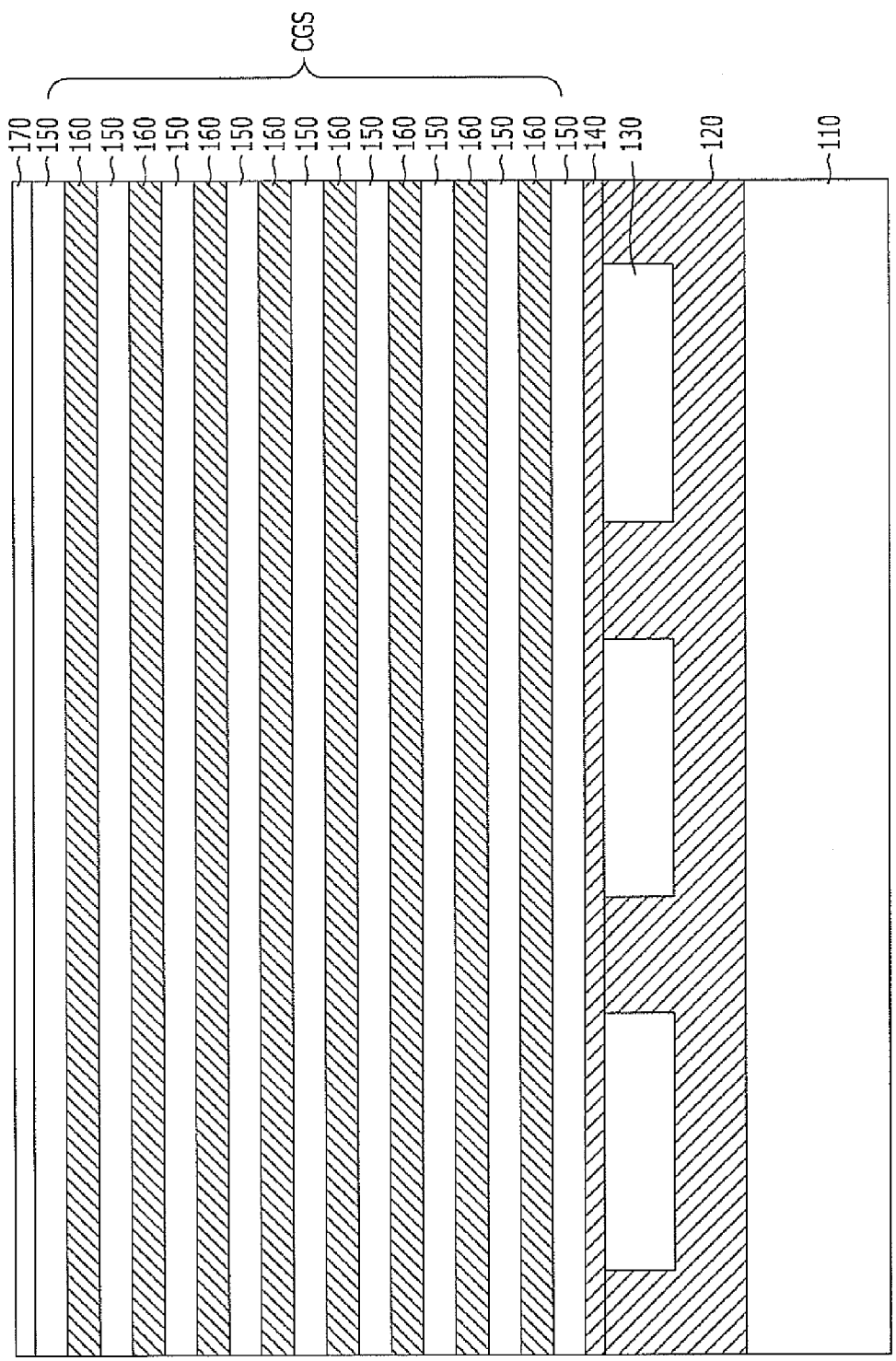

Referring to FIG. 3, a plurality of first inter-layer dielectric layers 150 and a plurality of third conductive layers 160 are alternately stacked to form a plurality of memory cells that are vertically stacked over the second conductive layer 140. Hereinafter, for the sake of convenience in description, the stacked structure where the first inter-layer dielectric layers 150 and the third conductive layers 160 are alternately stacked is referred to as a cell gate structure CGS. In the cell gate structure CGS, the lowermost layer and the uppermost layer may be the first inter-layer dielectric layers 150.

Each of the first inter-layer dielectric layers 150 isolate or separate two adjacent layers of memory cells from each other. The first inter-layer dielectric layers 150 may be silicon oxide layers. The third conductive layers 160 are used to form the gate electrodes of the memory cells. The third conductive layers 160 may be polysilicon layers doped with an impurity.

Subsequently, a first insulation layer 170 is formed over the cell gate structure CGS. The first insulation layer 170 may protect the cell gate structure CGS from being damaged and serves as a polish stop layer in a subsequent process (see FIG. 4) of etching or polishing the cell gate structure CGS. The first insulation layer 170 may include a material having a different etch rate from the etch rate of the first inter-layer dielectric layers 150. For example, the first insulation layer 170 may be a silicon nitride layer.

Figure 4:
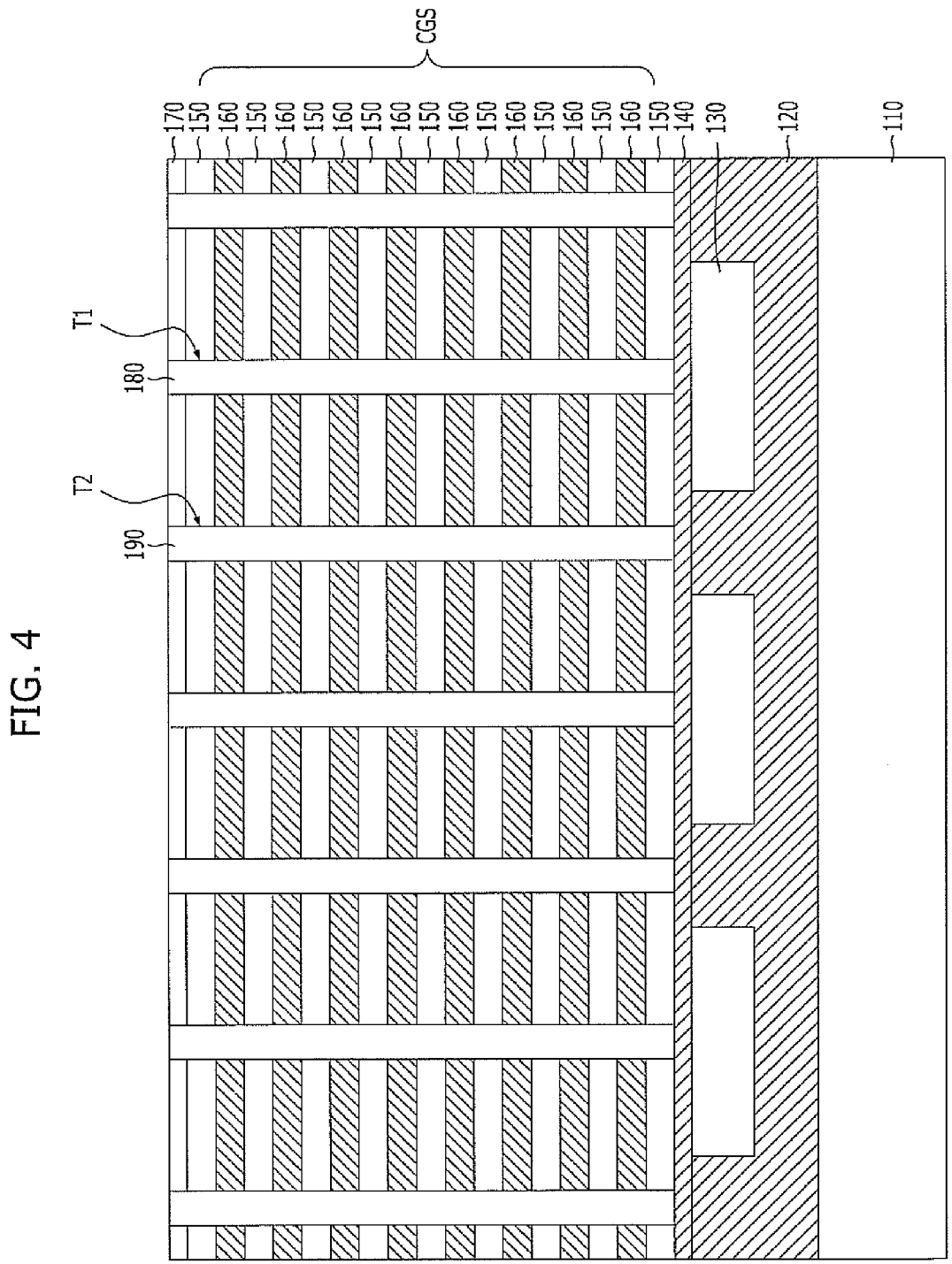

Referring to FIG. 4, first trenches T1 and second trenches T2 having a slit shape stretched or extended in a direction crossing the cross-sectional direction shown in the drawing (the y-axis direction) are formed in the cell gate structure CGS by selectively etching the cell gate structure CGS and the first insulation layer 170 between cell channel holes (refer to 'H1' of FIG. 5), which are to be formed through a subsequent process.

The first trenches T1 are formed to be disposed between a pair of cell channel holes that expose one first sacrificial layer pattern 130. The first trenches T1 isolate the third conductive layers 160 from each other between the pair of the cell channel holes to form a U-shaped string. The second trenches T2 are formed to be disposed between one and another pairs of cell channel holes. In this embodiment of the present invention, the first trenches T1 and the second trenches T2 are formed to have a depth to expose the second conductive layer 140, but the scope of the present invention is not limited to it.

The first trenches T1 and the second trenches T2 has such a depth as to penetrate all the third conductive layers 160, and the second trenches T2 may isolate the second conductive layer 140 by penetrating the second conductive layer 140.

The formation of the second trenches T2 may be omitted. Although the formation of the second trenches T2 is omitted and the third conductive layers 160 are coupled with each other between different pairs of cell channel holes, adjacent U-shaped strings may be individually controlled if the gates of corresponding pairs of selection transistors are isolated from etch other. This will be described in detail hereinafter with reference to FIG. 9.

Subsequently, a second sacrificial layer pattern 180 and a third sacrificial layer pattern 190 filling the first trenches T1 and the second trenches T2 are formed.

The second sacrificial layer pattern 180 and the third sacrificial layer pattern 190 may be formed by depositing a dielectric material over the substrate structure including the first trenches T1 and the second trenches T2, and performing a polishing process, such as a Chemical Mechanical Polishing (CMP) process, using the first insulation layer 170 as a polish stop layer. The second sacrificial layer pattern 180 and the third sacrificial layer pattern 190 may be silicon oxide layers.

Figure 5:
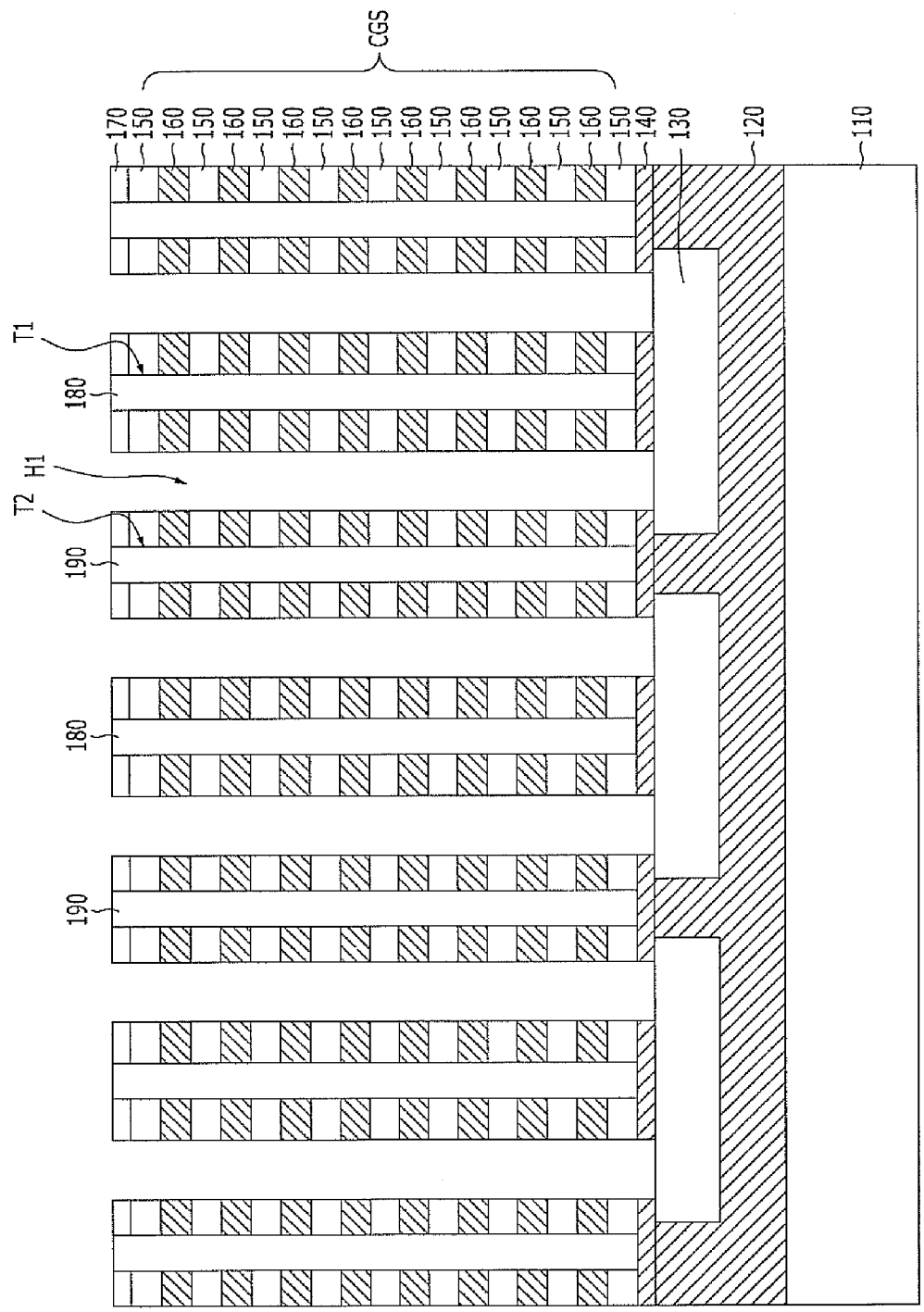

Referring to FIG. 5, a pair of cell channel holes H1 that expose the first sacrificial layer pattern 130 by penetrating through the cell gate structure CGS and the second conductive layer 140 are formed by selectively etching the first insulation layer 170, the cell gate structure CGS, and the second conductive layer 140.

The cell channel holes H1 are the space where the channels of the memory cells are to be formed. Respective pairs of cell channel holes H1 are disposed for the first sacrificial layer patterns 130. As three first sacrificial layer patterns 130 are illustrated in the drawing, six cell channel holes H1 that expose the three first sacrificial layer patterns 130 are exemplarily shown. Each pair of the cell channel holes H1 are arrayed in the longitudinal axis direction of the first sacrificial layer pattern 130.

Figure 6:
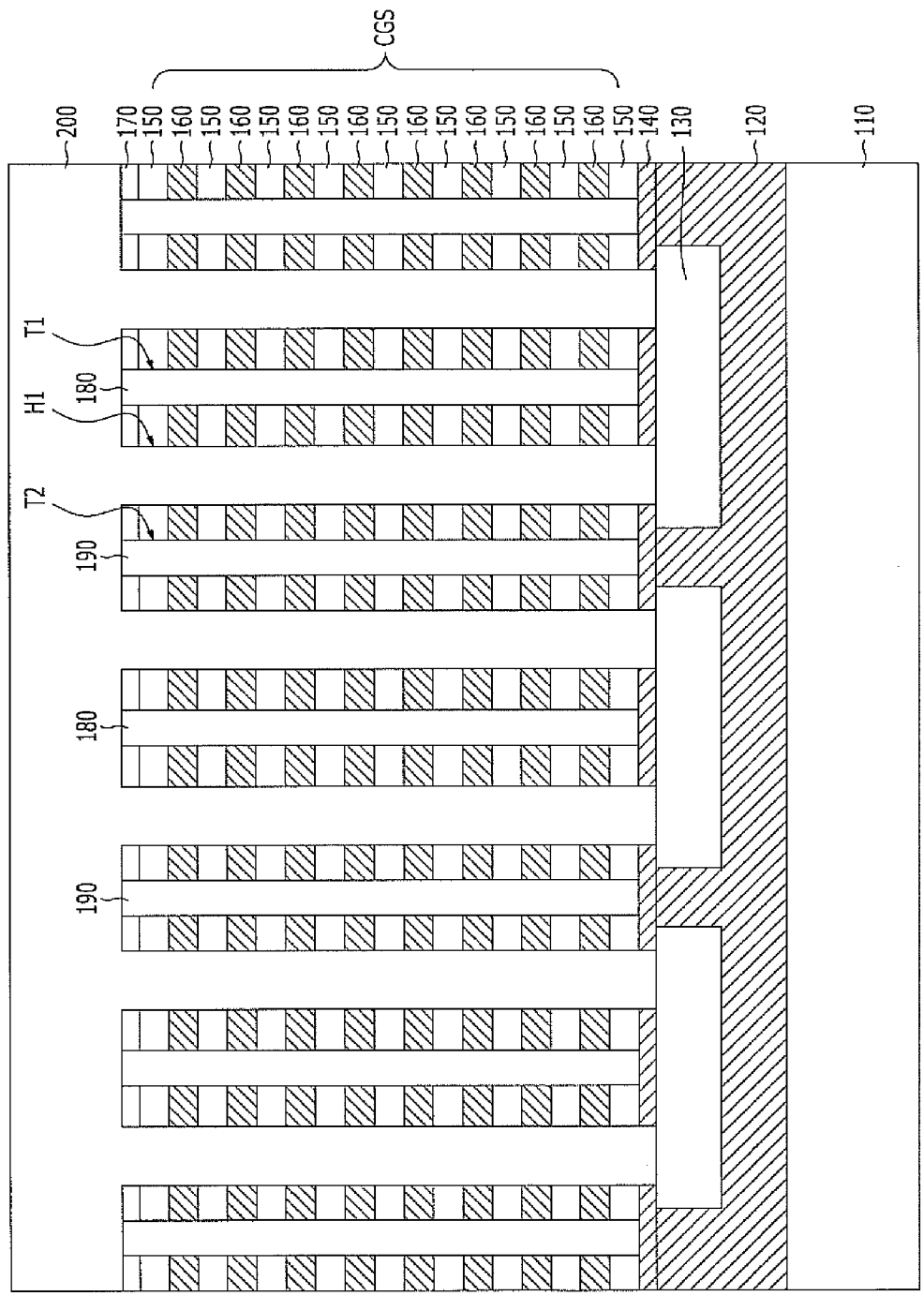

Referring to FIG. 6, a fourth sacrificial layer 200 is formed over the substrate structure including the cell channel holes H1. The fourth sacrificial layer 200 may be a silicon nitride layer.

Figure 7:
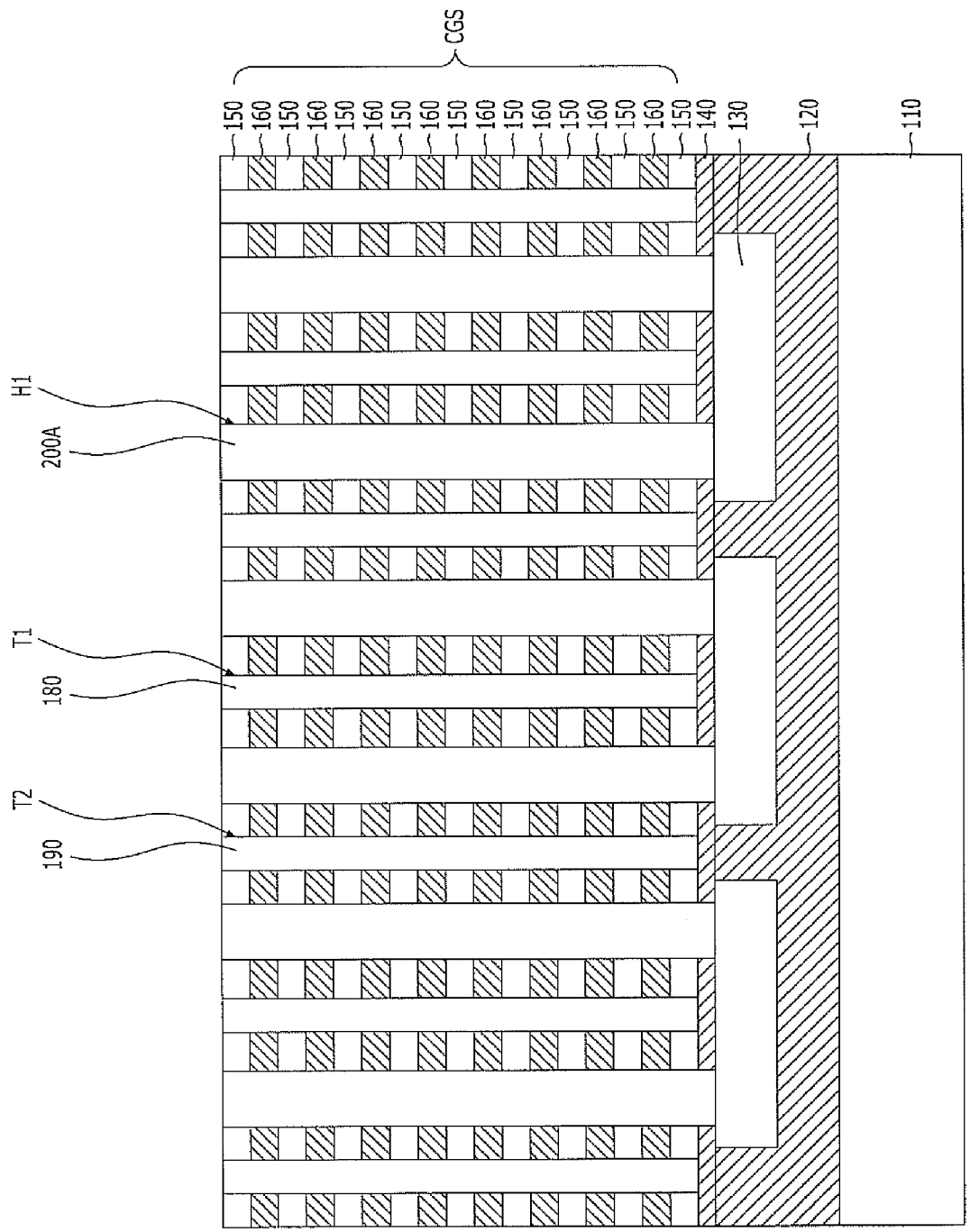

Referring to FIG. 7, fourth sacrificial layer patterns 200A filling the cell channel holes H1 are formed by performing a polishing process, e.g., a CMP process, until the uppermost first inter-layer dielectric layer 150 of the cell gate structure CGS is exposed.

Meanwhile, the sequence of the processes of FIGS. 4 to 7 may be changed. For example, although the first trenches T1 and the second trenches T2 are formed first and then the cell channel holes H1 are formed in the state that the first trenches T1 and the second trenches T2 are filled with a dielectric material in the first exemplary embodiment of the present invention, the scope of the present invention is not limited to it. Although not illustrated, according to another exemplary embodiment, the cell channel holes H1 may be formed first and then while the cell channel holes H1 are filled with a dielectric material, the first trenches T1 and the second trenches T2 may be formed.

Figure 8:
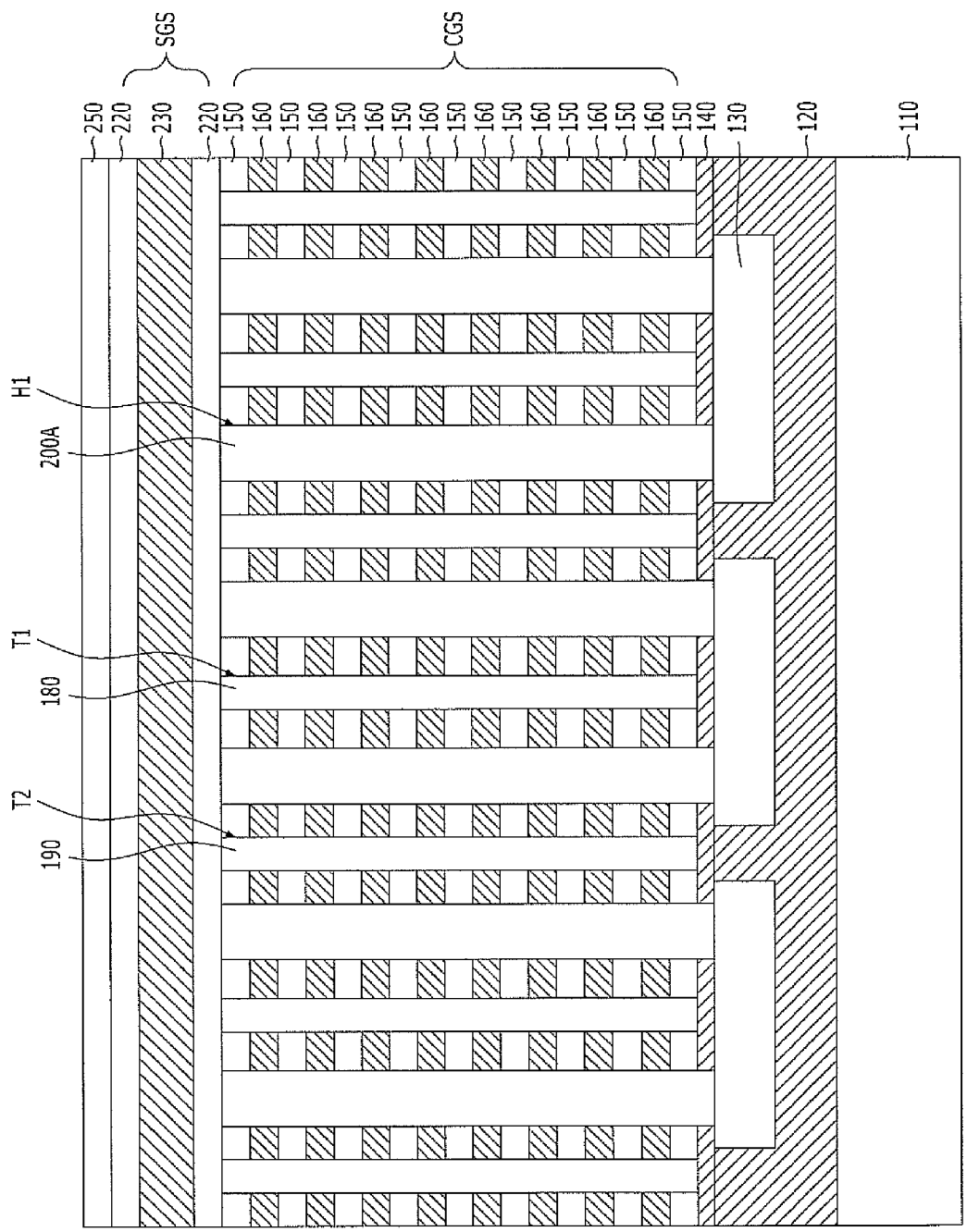

Referring to FIG. 8, a second inter-layer dielectric layer 220, a fourth conductive layer 230, and a second inter-layer dielectric layer 220 are sequentially formed to form a selection transistor over the cell gate structure CGS including the second sacrificial layer pattern 180, the third sacrificial layer pattern 190, and the fourth sacrificial layer patterns 200A. Hereinafter, for the sake of convenience in description, the stacked structure where the second inter-layer dielectric layer 220, the fourth conductive layer 230, and the second inter-layer dielectric layer 220 are stacked is referred to as a selection gate structure SGS.

The fourth conductive layer 230 is used to form a gate electrode of a selection transistor. The fourth conductive layer 230 may be a polysilicon layer doped with an impurity. The second inter-layer dielectric layer 220 insulates the fourth conductive layer 230 from the upper structure and the lower structure thereof. The second inter-layer dielectric layer 220 may be a silicon oxide layer.

Subsequently, a second insulation layer 250 is formed over the selection gate structure SGS. The second insulation layer 250 protects the selection gate structure SGS from being damaged and serves as a polish stop layer in a subsequent process of etching and polishing (refer to FIG. 9) the selection gate structure SGS. The second insulation layer 250 may be a silicon nitride layer.

Figure 9:
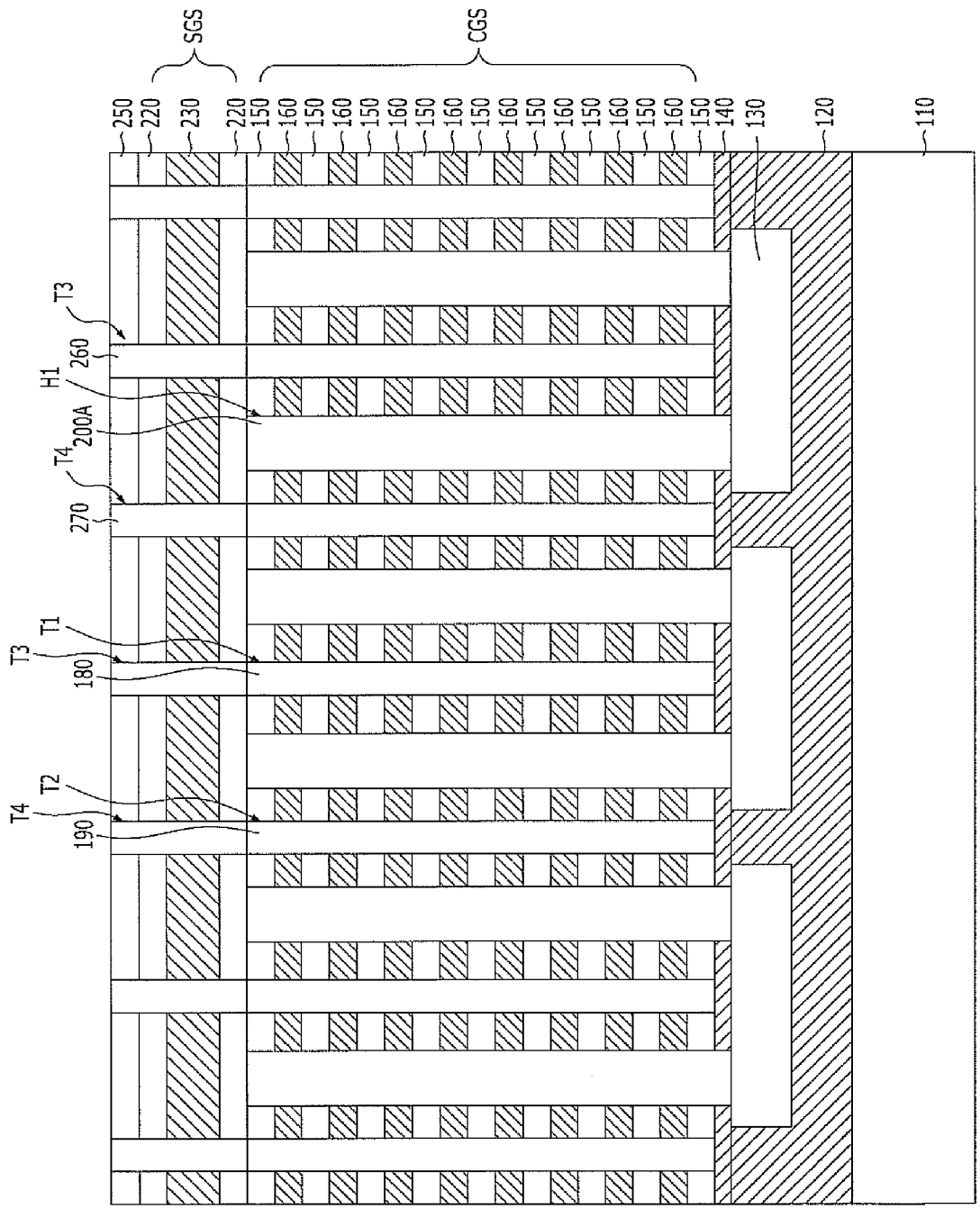

Referring to FIG. 9, third trenches T3 and fourth trenches T4 having a slit shape stretched in a direction crossing the cross-sectional direction shown in the drawing are formed in the selection gate structure SGS by selectively etching the selection gate structure SGS and the second insulation layer 250 between selection transistor channel holes (refer to 'H2' of FIG. 10), which are to be formed through a subsequent process. The third trenches T3 and the fourth trenches T4 may overlap with the first trenches T1 and the second trenches T2, respectively.

The third trenches T3 are to be disposed between a pair of selection transistor channel holes. The third trenches T3 isolate the fourth conductive layer 230 from each other between the pair of the selection transistor channel holes to form a drain selection transistor and a source selection transistor. The fourth trenches T4 are to be disposed between different pairs of selection transistor channel holes. To control adjacent U-shaped strings individually, the fourth conductive layer 230 is separated from each other between the different pairs of selection transistor channel holes H2.

Subsequently, a fifth sacrificial layer pattern 260 and a sixth sacrificial layer pattern 270 filling the third trenches T3 and the fourth trenches T4 are formed.

The fifth sacrificial layer pattern 260 and the sixth sacrificial layer pattern 270 may be formed by depositing a dielectric material over the substrate structure including the third trenches T3 and the fourth trenches T4, and performing a polishing process, such as a Chemical Mechanical Polishing (CMP) process, using the second insulation layer 250 as a polish stop layer. The fifth sacrificial layer pattern 260 and the sixth sacrificial layer pattern 270 may be silicon oxide layers.

Referring to FIG. 10, the selection transistor channel holes H2 that expose the fourth sacrificial layer patterns 200A are formed in the selection gate structure SGS by selectively etching the second insulation layer 250 and the selection gate structure SGS. The selection transistor channel holes H2 are the space for forming the channels of a selection transistor, and they are integrated with the cell channel holes F11.

The processes of FIGS. 9 and 10 may be reversed each other. To be specific, the third trenches T3 and the fourth trenches T4 are formed first and then in the state that the third trenches T3 and the fourth trenches T4 are filled with a dielectric layer, the selection transistor channel holes H2 are formed in the present embodiment of the present invention. However, the scope of the present invention is not limited to it. Although not illustrated, according to another embodiment of the present invention, the selection transistor channel holes H2 may be formed first and then while the selection transistor channel holes H2 are filled with a dielectric material, the third trenches T3 and the fourth trenches T4 may be formed.

Referring to FIG. 11, the fourth sacrificial layer patterns 200A exposed through the selection transistor channel holes H2 and the first sacrificial layer pattern 130 under the fourth sacrificial layer patterns 200A are removed.

The process of removing the fourth sacrificial layer patterns 200A and the first sacrificial layer pattern 130 may be a wet etch process. When the fourth sacrificial layer patterns 200A and the first sacrificial layer pattern 130 include the same material, e.g., silicon nitride layers, the fourth sacrificial layer patterns 200A and the first sacrificial layer pattern 130 may be removed through a one-time wet etch process using an etch solution including a phosphoric acid. The second insulation layer 250 may be removed together through the process of removing the fourth sacrificial layer patterns 200A and the first sacrificial layer pattern 130.

As a result of the process, a pair of cell channel holes H1 is revealed in the space from which the fourth sacrificial layer patterns 200A are removed, and a pipe channel hole PH is formed in the space from which the first sacrificial layer pattern 130 is removed. The pipe channel hole PH is the space for forming the channels of a pipe channel transistor, and it is disposed under the pair of the cell channel holes H1 to couple them with each other. After all, a U-shaped channel hole H2, H1, and PH is formed.

Referring to FIG. 12, a memory layer 280 and a channel layer 290 are formed along the internal walls of the pipe channel hole PH, the cell channel holes H1, and the selection transistor channel holes H2.

The memory layer 280 and the channel layer 290 may be formed by sequentially depositing a charge blocking layer, a charge trapping layer, and a tunnel insulation layer that are used as the memory layer 280 along the profile of the substrate structure including the selection transistor channel holes H2, the cell channel holes H1, and the pipe channel hole PH, depositing a semiconductor material used as the channel layer 290, for example, a polysilicon layer, over the tunnel insulation layer, and performing a polishing process, e.g., a CMP process, until the uppermost second inter-layer dielectric layer 220 is exposed.

Specifically, the charge blocking layer prevents charges in the charge trapping layer from transferring to the outside. The charge blocking layer may be an oxide layer. The charge trapping layer traps charges to store a data. The charge trapping layer may be a nitride layer. The tunnel insulation layer is used for charge tunneling, and it may be an oxide layer. In short, the memory layer 280 may have a triple-layer structure of oxide-nitride-oxide (ONO).

Also, the channel layer 290 includes a first portion formed in the pipe channel hole PH and used as the channels of a pipe channel transistor by having a contact with the first conductive layer 120 and the second conductive layer 140 that are used as a gate electrode of the pipe channel transistor, a second portion formed in the cell channel holes H1 and used as the channels of a memory cell by having a contact with the third conductive layers 160 that is used as a gate electrode of the memory cell, and a third portion formed in the selection transistor channel holes H2 and used as the channels of a selection transistor by contacting with the fourth conductive layer 230 that is used as a gate electrode of the selection transistor.

In this embodiment of the present invention, the channel layer 290 is formed to fill the selection transistor channel holes H2, the cell channel holes H1, and the pipe channel hole PH where the memory layer 280 is formed, but the scope of the present invention is not limited to it. According to another exemplary embodiment of the present invention, the channel layer 290 may be formed to be thin in such a thickness that the channel layer 290 does not completely fills the selection transistor channel holes H2, the cell channel holes H1, and the pipe channel hole PH.

Through the above-described fabrication process, the non-volatile memory device in accordance with the embodiment of the present invention shown in FIG. 12 may be fabricated.

Referring to FIG. 12, the first conductive layer 120 and the second conductive layer 140, that are used as a gate electrode of the pipe channel transistor, not only have a contact with the side and bottom surfaces of the channel layer 290 filling the pipe channel hole PH but also have a contact with the upper surface of the channel layer 290 (refer to reference symbol 'B' of FIG. 12). Moreover, the area of the side surface of the memory layer 280 that has a contact with the first conductive layer 120 and the second conductive layer 140 may be increased in proportion to the thickness of the second conductive layer 140. Therefore, the gate bias applied to the gate electrode of the pipe channel transistor may be adequately applied to the channel layer 290 of the pipe channel transistor, and since an inversion layer may be formed in the portion of the channel layer 290 that has a contact with a B region, on-current is greatly increased. These effects are experimentally confirmed and it is shown in FIGS. 13A to 13C.

Figure 13B:
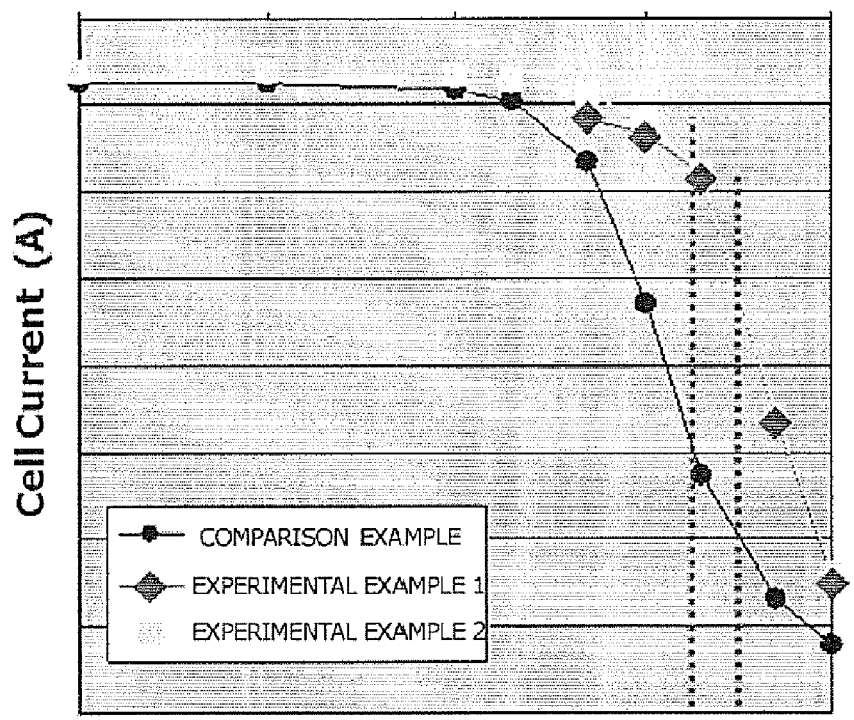
Figure 13C:
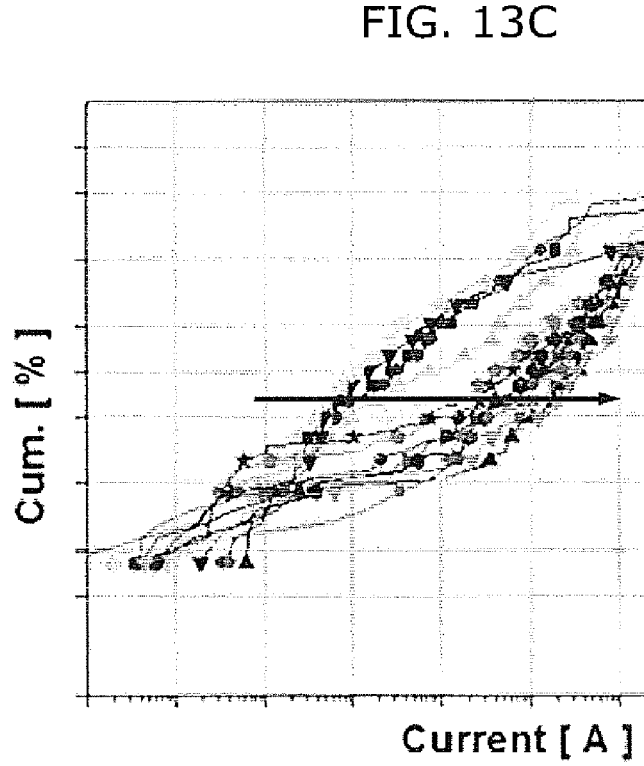

FIGS. 13A to 13C show the effects of the non-volatile memory device in accordance with an embodiment of the present invention.

FIG. 13A shows a case (refer to Comparison Example) that the upper surface of the channels of the pipe channel transistor (i.e., the pipe channel hole) is not covered with a conductive material just as in the conventional technology, and a case (refer to Experimental Examples 1 and 2) that a portion of or the entire upper surface of the channels of the pipe channel transistor is covered with a conductive material just as in the exemplary embodiment of the present invention. In particular, in the case of Experimental Example 2, the first trenches T1 do not penetrate the second conductive layer 140 as shown in FIGS. 4 and 5, and the entire upper surface of the channels of the pipe channel transistor is covered with a conductive material except the portion where the channels of a memory cell are formed. On the other hand, Experimental Example 1 shows a case that the first trenches T1 of FIGS. 4 and 5 are formed deep enough to penetrate the second conductive layer 140. Except a portion where the channels of a memory cell are formed and a portion where the first trenches T1 are formed, the upper surface of the channels of the pipe channel transistor is covered with a conductive material.

FIG. 13B is a graph showing on-current measurement results for the cases of FIG. 13A.

Referring to FIG. 13B, the on-current measured in Experimental Example 1 is greater than that of Comparison Example, and the on-current measured in Experimental Example 2 is greater than that of Experimental Example 1. Therefore, it may be confirmed that the on-current increases as the area of the conductive material covering the upper surface of the channels of the pipe channel transistor increases.

FIG. 3C is a graph showing on-current measurement results depending on the thickness of the conductive material (refer to the thickness of the second conductive layer 140 of FIGS. 2 to 12) covering the upper surface of the channels of the pipe channel transistor.

It may be seen from FIG. 13C that the on-current increases (refer to the arrow direction), as the conductive material becomes thick.

After all, as the area and/or thickness of the conductive material covering the upper surface of the channels of the pipe channel transistor, that is, the area and/or thickness of the second conductive layer 140, increases, on-current increases.

The above-described sequence of the method and process for fabricating the non-volatile memory device may be modified diversely.

For example, the processes (refer to FIGS. 3 to 7) of forming the cell gate structure CGS and forming the cell channel holes H1, the first trenches T1, and the second trenches T2 penetrating the cell gate structure CGS and the processes of forming the selection gate structure SGS and forming the selection transistor channel holes H2, the third trenches T3, and the fourth trenches T4 penetrating the selection gate structure SGS are performed separately in the embodiment of the present invention. However, the scope of the present invention is not limited to it. According to another embodiment of the present invention, the cell gate structure CGS and the selection gate structure SGS may be stacked together and then channel holes and trenches that penetrate the cell gate structure CGS and the selection gate structure SGS may be formed by collectively etching the cell gate structure CGS and the selection gate structure SGS. Of course, the order of the processes of forming the trenches and the channel holes may be reversed.

Also, in the present embodiment, the gate insulation layer and channel of the pipe channel transistor, the gate insulation layer and channel of the memory cell, and the gate insulation layer and channel of the selection transistor are formed all together by forming the memory layer 280 and the channel layer 290 in the state that the U-shaped channel holes, which are the selection transistor channel holes H2, the cell channel holes H1, and the pipe channel hole PH of FIG. 11, are formed. However, the scope of the present invention is not limited to it, and the gate insulation layer and channels of the pipe channel transistor, the gate insulation layer and channels of the memory cell, and the gate insulation layer and channels of the selection transistor may be formed through separate processes. For example, the hole PH is formed by removing the first sacrificial layer pattern 130 exposed through the cell channel holes H1 that are formed through the process of FIG. 5, and the memory layer and the channel layer may be formed in the holes H1 and PH. Thereafter, the selection transistor channel holes H2 penetrating the selection gate structure SGS are formed and the gate insulation layer and the channel layer may be formed in the selection transistor channel holes H2.

Also, a sacrificial material may be used in the cell gate structure CGS and the selection gate structure SGS instead of the third conductive layers 160 and the fourth conductive layer 230, or a sacrificial material may be used instead of the first inter-layer dielectric layers 150 and the second inter-layer dielectric layer 220. This is described in detail below with reference to FIGS. 14 to 17.

Figure 14:
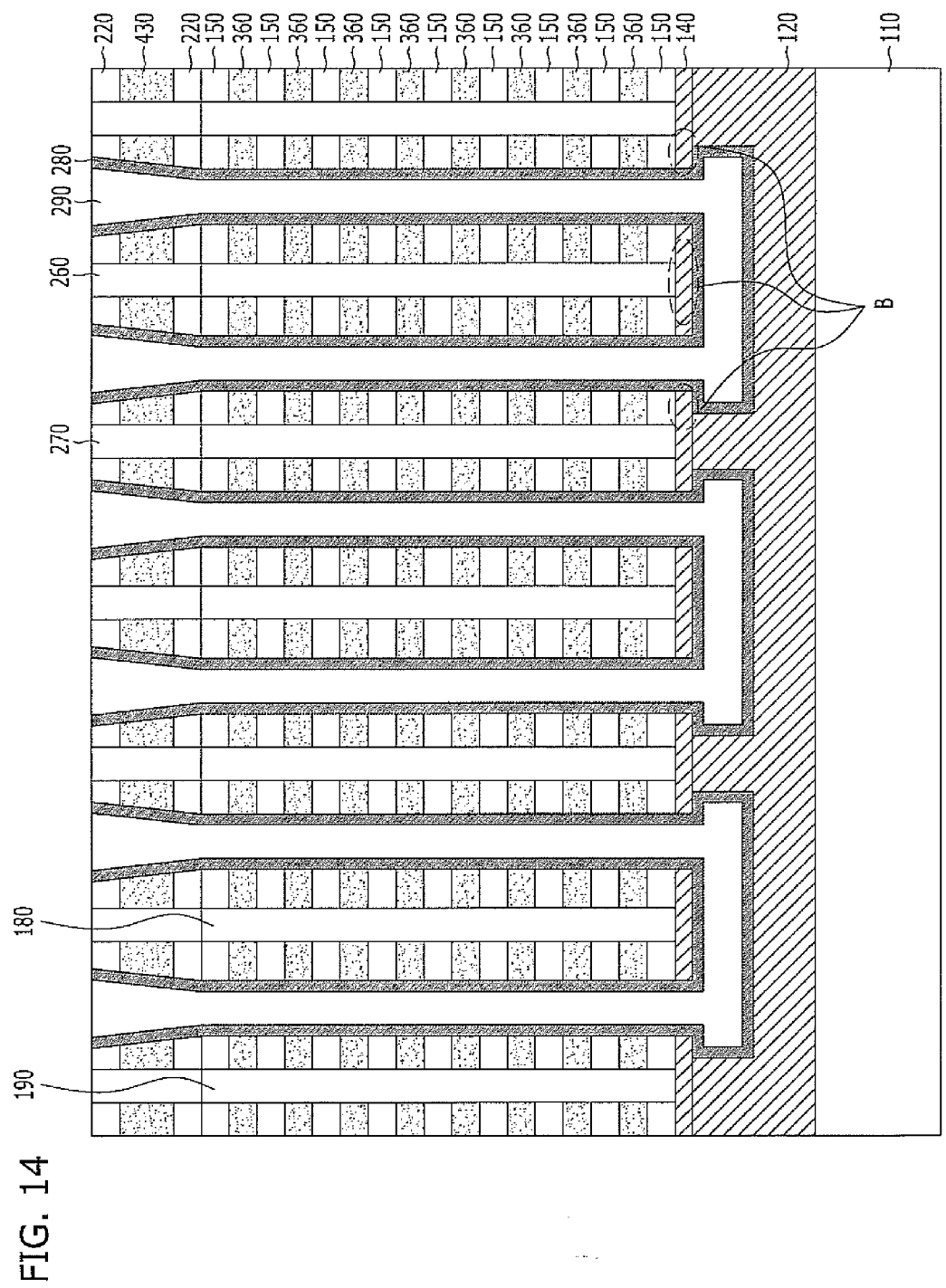
FIGS. 14 and 15 are cross-sectional views illustrating another method for fabricating the non-volatile memory device shown in FIG. 12.
Figure 15:
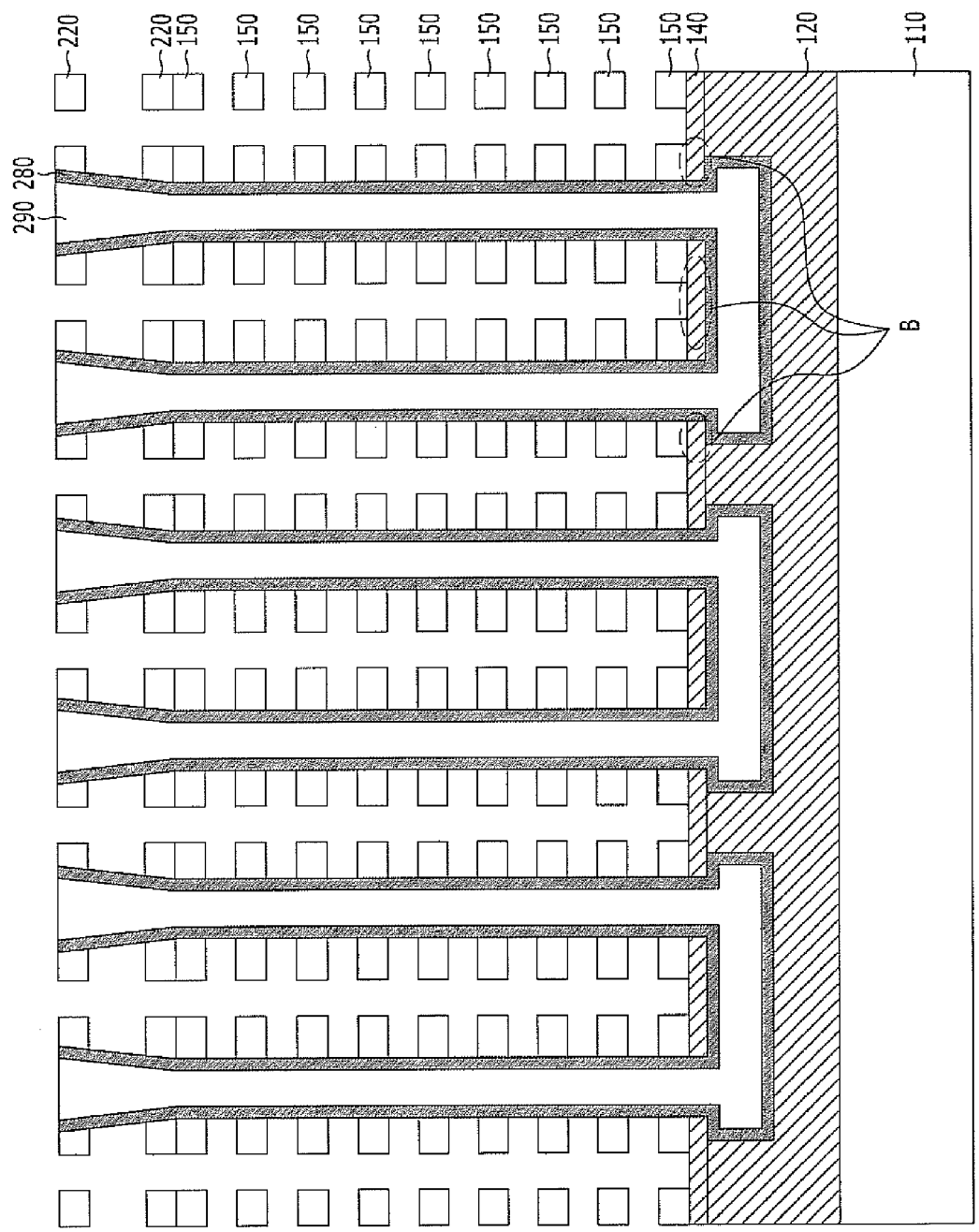

FIGS. 14 and 15 are cross-sectional views illustrating another exemplary method for fabricating the non-volatile memory device of FIG. 12.

Referring to FIG. 14, substantially the same process as described in the above with reference to FIGS. 2 to 12 is performed, except that the third conductive layers 160 are substituted with seventh sacrificial layers 360 and the fourth conductive layer 230 is substituted with an eighth sacrificial layer 430. The seventh sacrificial layers 360 and the eighth sacrificial layer 430 may be silicon nitride layers.

Referring to FIG. 15, the seventh sacrificial layers 360 and the eighth sacrificial layer 430 are exposed after the second and third sacrificial layer patterns 180 and 190 and the fifth and sixth sacrificial layer patterns 260 and 270 are removed, and the exposed seventh sacrificial layer 360 and the exposed eighth sacrificial layer 430 are removed.

Although not illustrated in the drawing, a structure similar to that of FIG. 12 may be obtained subsequently by filling the space from which the seventh sacrificial layers 360 and the eighth sacrificial layer 430 are removed with a conductive material for forming a cell gate electrode, for example, a polysilicon layer doped with an impurity or a metal such as tungsten.

Meanwhile, the charge blocking layer of the memory layer 280 may be exposed and damaged in middle of the process of removing the seventh sacrificial layers 360 and the eighth sacrificial layer 430. Therefore, after the seventh sacrificial layers 360 and the eighth sacrificial layer 430 are removed and before the conductive material for forming a cell gate electrode is disposed, the damaged charge blocking layer may be removed, or a material for forming a charge blocking layer, e.g., an oxide layer or a high-k dielectric layer like $Al_2O_3$, may be additionally formed on the damaged charge blocking layer.

Figure 16:
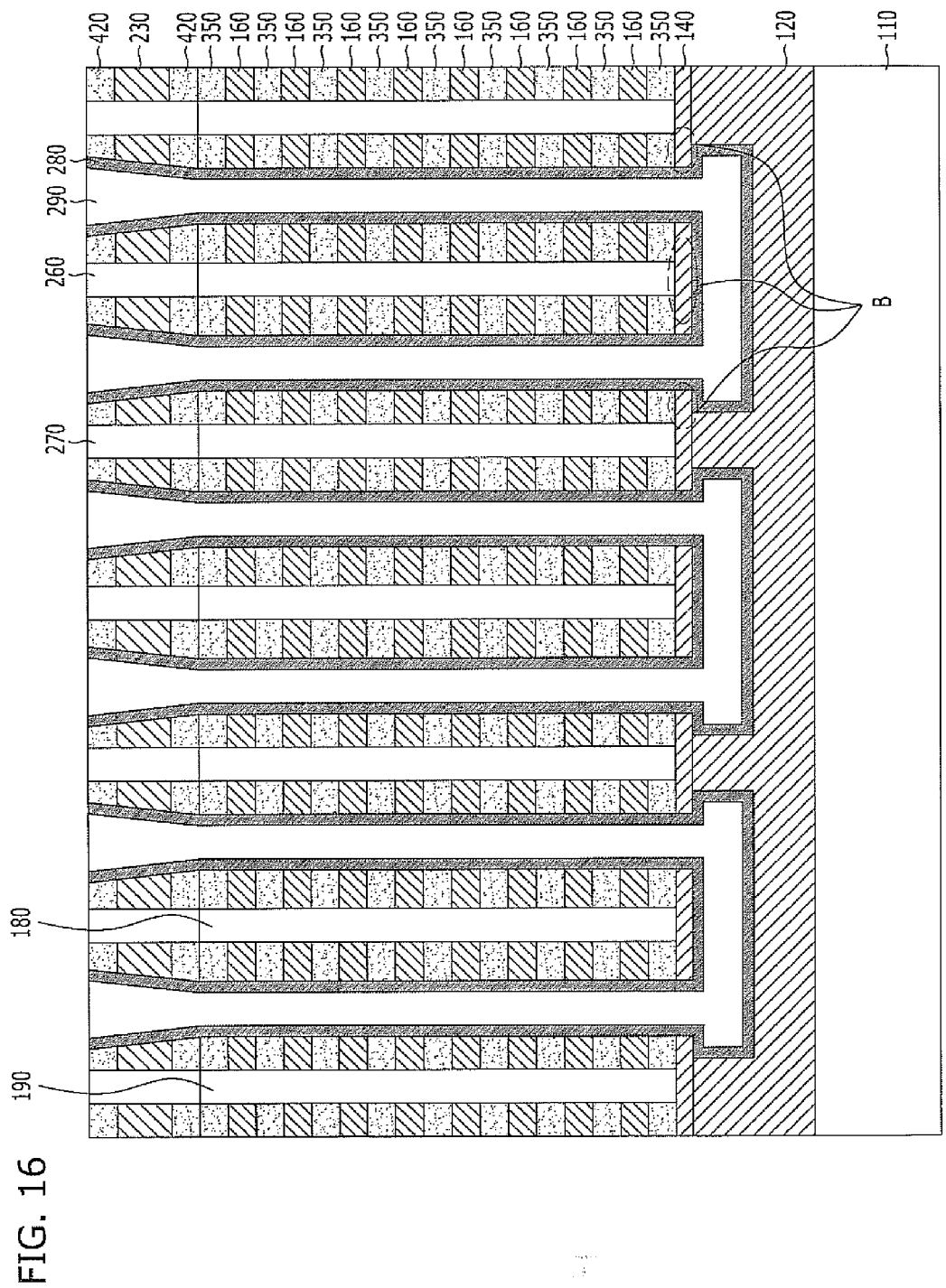
FIGS. 16 and 17 are cross-sectional views illustrating yet another method for fabricating the non-volatile memory device shown in FIG. 12.
Figure 17:
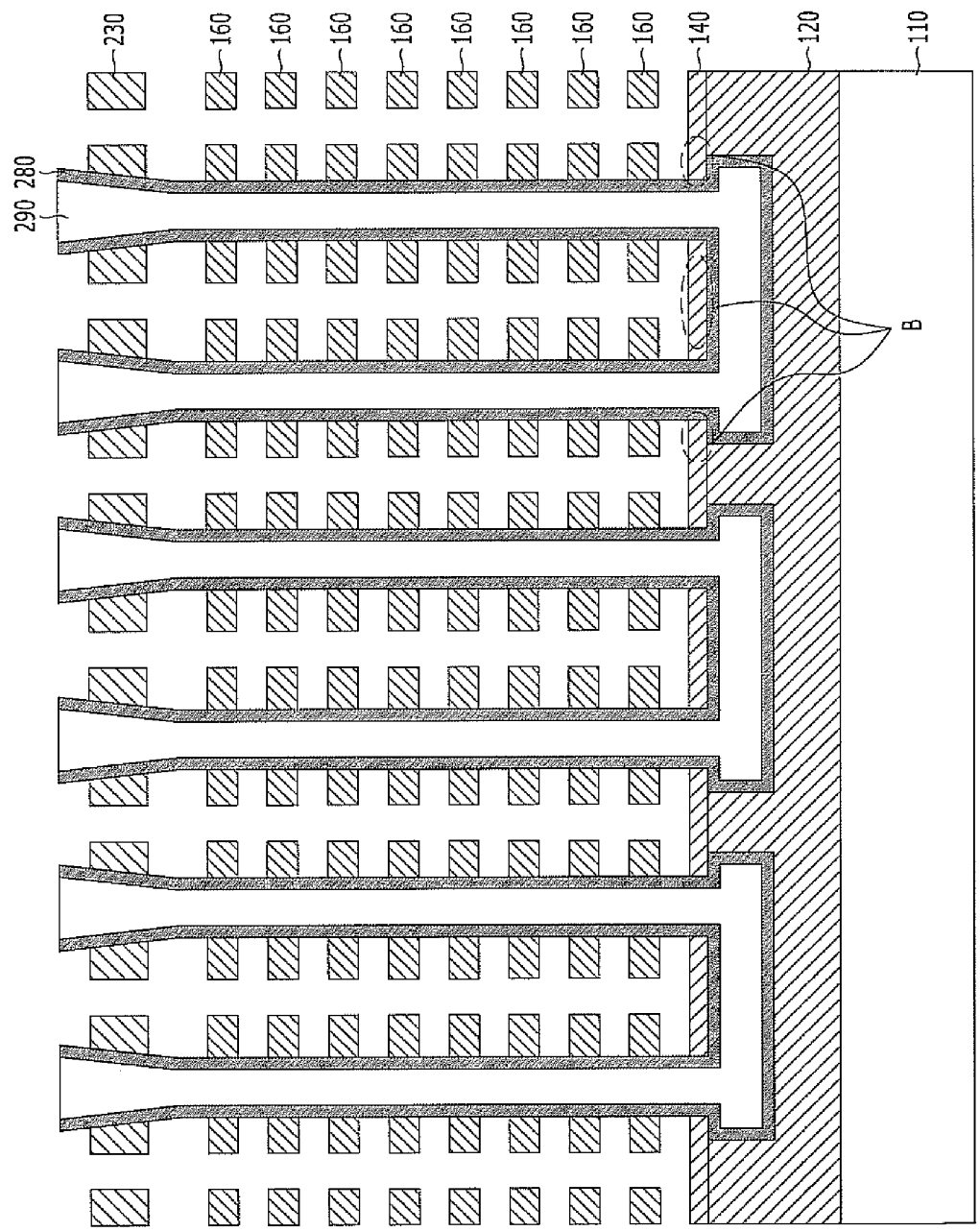

FIGS. 16 and 17 are cross-sectional views illustrating yet another exemplary method for fabricating the non-volatile memory device of FIG. 12.

Referring to FIG. 16, substantially the same process as described in the above with reference to FIGS. 2 to 12 is performed, except that the first inter-layer dielectric layers 150 are substituted with ninth sacrificial layers 350 and the second inter-layer dielectric layer 220 is substituted with a tenth sacrificial layer 420. The ninth sacrificial layer 350 and the tenth sacrificial layer 420 may be polysilicon layer not doped with an impurity.

Referring to FIG. 17, the ninth sacrificial layers 350 and the tenth sacrificial layer 420 are exposed after the second and third sacrificial layer patterns 180 and 190 and the fifth and sixth sacrificial layer patterns 260 and 270 are removed, and the exposed ninth sacrificial layers 350 and the exposed tenth sacrificial layer 420 are removed.

Although not illustrated in the drawing, a structure similar to that of FIG. 12 may be obtained subsequently by filling the space from which the ninth sacrificial layers 350 and the tenth sacrificial layer 420 are removed with a dielectric material, for example, an oxide layer.

Meanwhile, although the cell region of the three-dimensional non-volatile memory device is described in the embodiments described above, the non-volatile memory device further includes a peripheral circuit region. The peripheral circuit region of the non-volatile memory device is described in detail below with reference to FIGS. 18 to 20.

Figure 18:
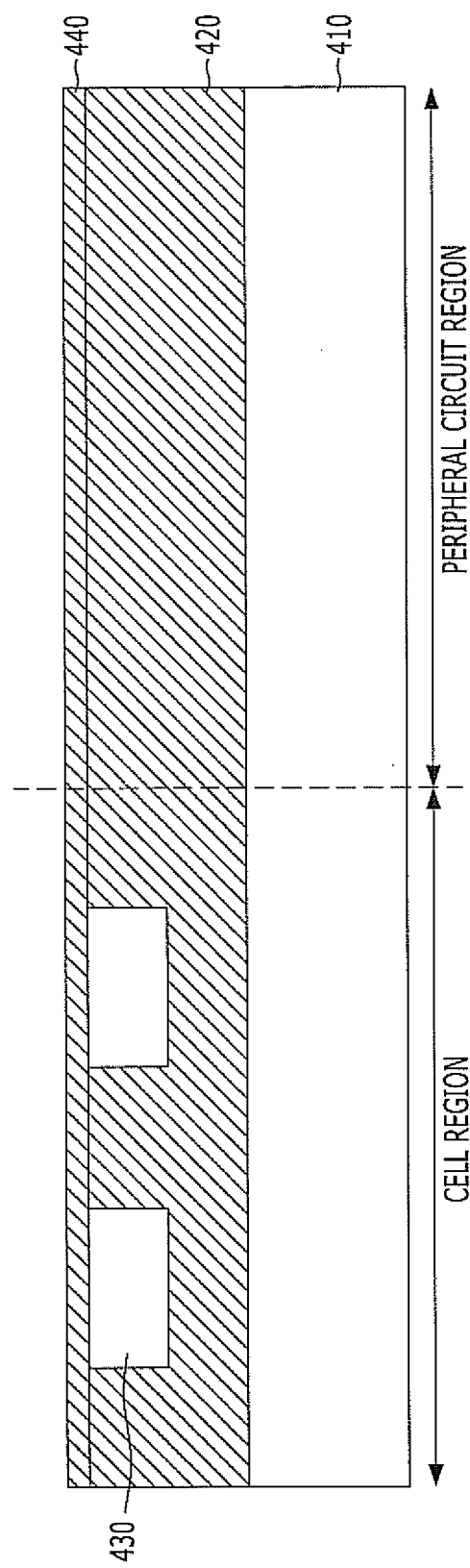
FIGS. 18 and 19 are cross-sectional views illustrating a non-volatile memory device having a three-dimensional structure and a fabrication method thereof in accordance with a second exemplary embodiment of the present invention.
Figure 19:
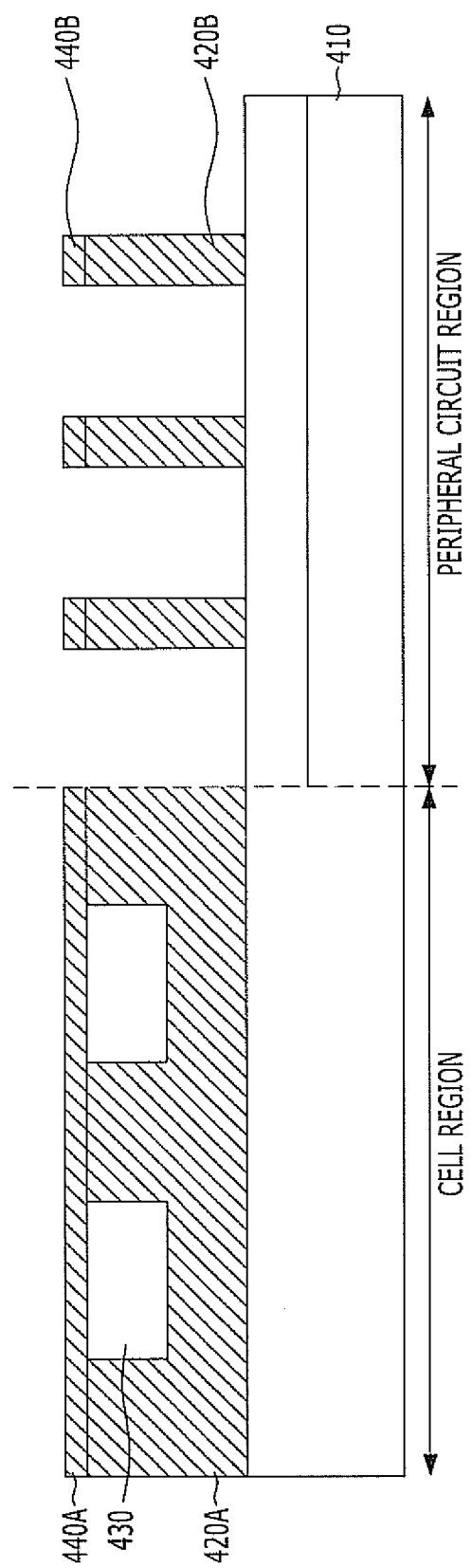

FIGS. 18 and 19 are cross-sectional views illustrating a non-volatile memory device having a three-dimensional structure and a fabrication method thereof in accordance with a second embodiment of the present invention.

Referring to FIG. 18, a first conductive layer 420 is formed over a substrate 410 defined with a cell region and a peripheral circuit region. The first conductive layer 420 is for forming a gate electrode of a pipe channel transistor in the cell region and for forming a gate electrode of the peripheral circuit region.

The substrate 410 may include a semiconductor substrate, such as a silicon substrate, and an insulation layer, such as a silicon oxide layer, that is disposed over the semiconductor substrate. The first conductive layer 420 may include polysilicon doped with an impurity.

Subsequently, a first sacrificial layer pattern 430 that is buried in the first conductive layer 420 and defines the space where a pipe channel hole is to be formed is formed by selectively etching the first conductive layer 420 of the cell region to form a groove in the first conductive layer 420 and filling the groove with a dielectric material, such as a silicon nitride layer.

Subsequently, a second conductive layer 440 is formed over the profile of the resultant substrate structure. The second conductive layer 440 may be used as a gate electrode of the pipe channel transistor in the cell region along with the first conductive layer 420 and used as a gate electrode of the peripheral circuit region as well. The second conductive layer 440 may include the same material as that of the first conductive layer 420, for example, polysilicon doped with an impurity. The second conductive layer 440 may also be a metal or a metal silicide.

Referring to FIG. 19, a mask pattern (not shown) covering a region of a gate electrode in the peripheral circuit region while covering the entire cell region is formed over the second conductive layer 440, and then the second conductive layer 440 and the first conductive layer 420 are etched using the mask pattern as an etch barrier.

As a result of the process, a gate electrode 420A and 440A of the pipe channel transistor is formed in the cell region, and a gate electrode 420B and 440B of a peripheral circuit transistor is formed in the peripheral circuit region.

The subsequent processes are substantially the same as those described with reference to FIGS. 3 to 12, further description is omitted.

Figure 20:
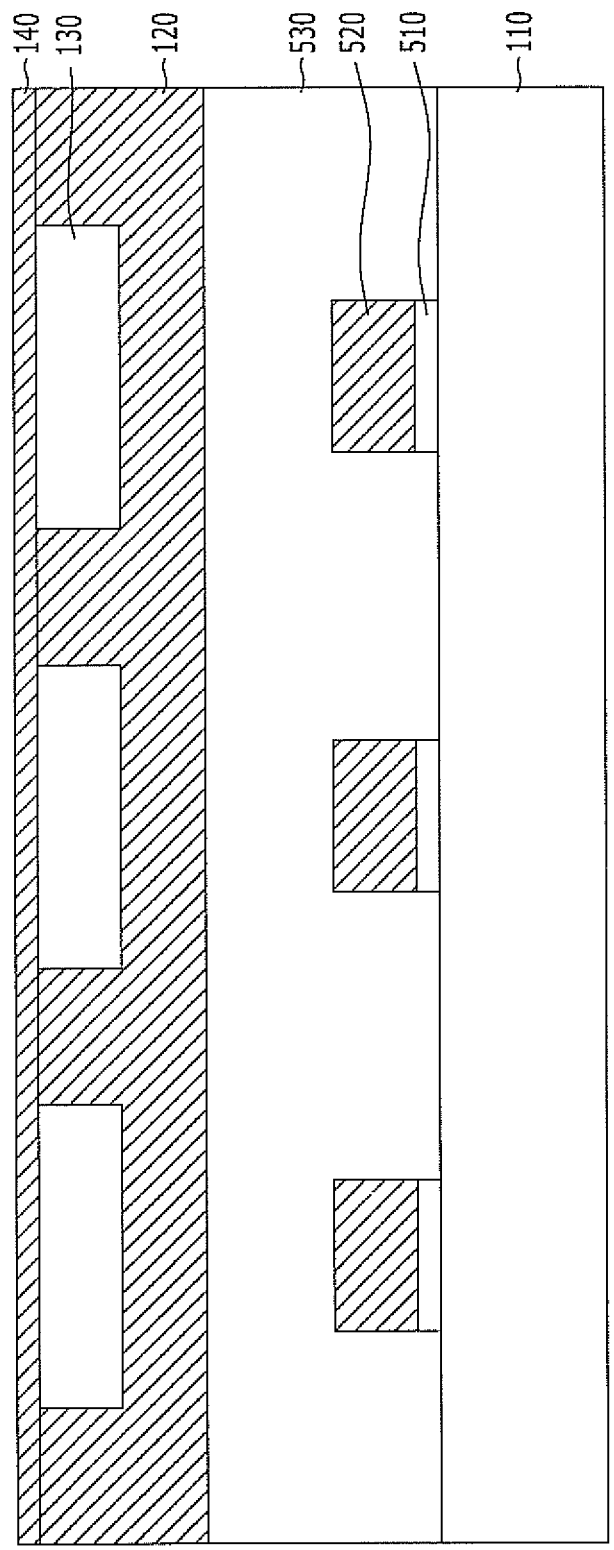
FIG. 20 is a cross-sectional view illustrating a non-volatile memory device having a three-dimensional structure and a fabrication method thereof in accordance with a third exemplary embodiment of the present invention.

FIG. 20 is a cross-sectional view illustrating a non-volatile memory device having a three-dimensional structure and a fabrication method thereof in accordance with a third embodiment of the present invention.

Referring to FIG. 20, an insulation layer and a conductive layer are deposited over a substrate 110 and patterned so as to form a stacked structure where a gate insulation layer pattern 510 and a gate electrode 520 of a peripheral circuit transistor are stacked.

Subsequently, an insulation layer 530 covering the stacked structure is formed. The insulation layer 530 isolates a peripheral circuit region from a cell region that is to be formed over the peripheral circuit region. The insulation layer 530 may be an oxide layer.

Subsequently, a first conductive layer 120 filled with a first sacrificial layer pattern 130 and a second conductive layer 140 are formed over the insulation layer 530.

The subsequent processes are substantially the same as those described with reference to FIGS. 3 to 12, further description is omitted.

According to the processes of FIGS. 18 to 20, when the peripheral circuit region and the cell region are disposed in parallel, the gate electrode of the peripheral circuit transistor may be formed along with the gate electrode of the pipe channel transistor. Also, the peripheral circuit region may be disposed under the cell region.

According to the non-volatile memory device and the fabrication method thereof, since on-current is increased in the non-volatile memory device having a three-dimensional structure where memory cells are formed along the channels perpendicularly protruding from a substrate and a pipe channel transistor is disposed under the memory cells, the operation characteristics of the non-volatile memory device may be improved.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
a substrate;
a first conductive layer over the substrate;
a second conductive layer on the first conductive layer, wherein the second conductive layer is in direct contact with the first conductive layer to form a gate electrode of a pipe channel transistor;
a stacked structure disposed over the second conductive layer, wherein the stacked structure includes a plurality of first inter-layer dielectric layers and a plurality of third conductive layers alternately stacked;
a pair of first channels that penetrate the stacked structure and the second conductive layer;
a second channel which is buried in the first conductive layer, covered by the second conductive layer, and coupled to lower ends of the pair of the first channels; and
a memory layer formed along the first and second channels.

2. The non-volatile memory device of claim 1, wherein the first conductive layer and the second conductive layer include polysilicon doped with an impurity.

3. The non-volatile memory device of claim 1, wherein the first conductive layer includes polysilicon doped with an impurity, and the second conductive layer includes a metal or a metal silicide.

4. The non-volatile memory device of claim 1, further comprising:
a trench for isolating the third conductive layers for the respective first channels penetrating the stacked structure between the pair of the first channels, wherein the third conductive layers are divided into two portions of the third conductive layers for the respective first channels.

5. The non-volatile memory device of claim 1, further comprising:
a trench for isolating the third conductive layers for the respective first channels penetrating the stacked structure and the second conductive layer between the pair of the first channels, wherein the third conductive layers are divided into two portions of the third conductive layers for the respective first channels.

6. The non-volatile memory device of claim 1, further comprising:
a gate electrode of a peripheral circuit transistor formed over the substrate; and
an insulation layer for covering the substrate including the gate electrode,
wherein the first conductive layer is formed over the insulation layer.

7. The non-volatile memory device of claim 1, further comprising:
a gate electrode of a peripheral circuit transistor formed in a peripheral circuit region of the substrate,
wherein the gate electrode is formed of the same material as the first conductive layer and the second conductive layer on the same level as the first conductive layer and the second conductive layer.

8. The non-volatile memory device of claim 7, wherein the first conductive layer includes polysilicon doped with an impurity, and the second conductive layer includes a metal or a metal silicide.

* * * * *